United States Patent
Weidinger

(10) Patent No.: US 10,455,703 B2
(45) Date of Patent: Oct. 22, 2019

(54) METHOD FOR PRODUCING A PRINTED CIRCUIT BOARD WITH AN EMBEDDED SENSOR CHIP, AND PRINTED CIRCUIT BOARD

(71) Applicant: AT&S Austria Technologie & Systemtechnik Aktiengesellschaft, Leoben (AT)

(72) Inventor: Gerald Weidinger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 86 days.

(21) Appl. No.: 15/121,844

(22) PCT Filed: Feb. 20, 2015

(86) PCT No.: PCT/AT2015/050046
§ 371 (c)(1),
(2) Date: Aug. 26, 2016

(87) PCT Pub. No.: WO2015/127486
PCT Pub. Date: Sep. 3, 2015

(65) Prior Publication Data
US 2017/0020001 A1  Jan. 19, 2017

(30) Foreign Application Priority Data
Feb. 28, 2014 (AT) .............................. A 50154/2014

(51) Int. Cl.
*H05K 1/18* (2006.01)
*H01L 23/31* (2006.01)
(Continued)

(52) U.S. Cl.
CPC ......... *H05K 1/188* (2013.01); *H01L 21/6836* (2013.01); *H01L 23/3121* (2013.01);
(Continued)

(58) Field of Classification Search
USPC ........................................................ 361/761
See application file for complete search history.

(56) References Cited

U.S. PATENT DOCUMENTS 6,262,513 B1 * 7/2001 Furukawa ............... H01L 21/56
257/E21.502

FOREIGN PATENT DOCUMENTS

JP          2011-082583    *   4/2011  ............. H01L 23/12

* cited by examiner

*Primary Examiner* — Andargie M Aychillhum
(74) *Attorney, Agent, or Firm* — Eversheds Sutherland (US) LLP

(57) ABSTRACT

A method for producing a printed circuit board (10) having at least one embedded sensor chip (3), in which at least one sensor face (5) and terminals (4) are arranged on a face of the chip, said method comprising the following steps:
  a) providing an adhesive film (1),
  b) printing a conductor structure (2) formed from a conductive paste onto a surface of the adhesive film,
  c) placing the at least one sensor chip (3) with the face comprising the at least one sensor face (5) and the terminals (4) onto the conductor structure (2) formed from a conductive paste, in an indexed manner,
  d) curing the conductive paste,
  e) applying an insulation layer (6) having a conductor layer (7) arranged thereabove to the surface of the structure, created in the previous steps, comprising the chip (3),
  f) laminating the structure created in the previous steps,
  g) structuring the conductor layer (7) and forming vias (9) from the conductor layer to conductive tracks (7*b*, 7*c*) of the conductor structure on the surface of the adhesive film, and
  h) removing the adhesive film (1).

9 Claims, 2 Drawing Sheets

Figure 1:
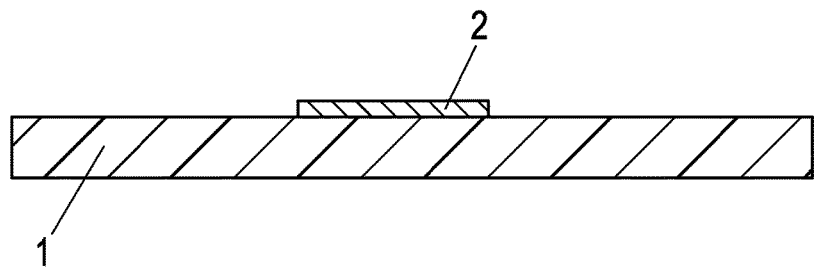

(51) Int. Cl.
*H01L 21/683* (2006.01)
*H05K 3/20* (2006.01)
*H05K 3/00* (2006.01)
*H01L 23/538* (2006.01)
*H05K 1/09* (2006.01)
*H05K 1/11* (2006.01)
*H05K 3/12* (2006.01)
*H05K 3/32* (2006.01)
*H05K 3/40* (2006.01)

(52) U.S. Cl.
CPC ......... *H01L 23/5389* (2013.01); *H05K 1/095* (2013.01); *H05K 1/115* (2013.01); *H05K 1/183* (2013.01); *H05K 3/007* (2013.01); *H05K 3/1216* (2013.01); *H05K 3/207* (2013.01); *H05K 3/321* (2013.01); *H05K 3/4038* (2013.01); *H01L 2221/68372* (2013.01); *H01L 2224/48137* (2013.01); *H05K 2201/10151* (2013.01)

METHOD FOR PRODUCING A PRINTED CIRCUIT BOARD WITH AN EMBEDDED SENSOR CHIP, AND PRINTED CIRCUIT BOARD

The invention relates to a method for producing a printed circuit board having at least one embedded sensor chip, in which the sensor face and terminals are arranged on a face of the chip.

The invention also relates to a printed circuit board, consisting of at least one insulation layer and at least one structured conductor layer having at least one embedded sensor chip, in which at least one sensor face and terminals are arranged on a face of the chip and lie substantially in a coplanar manner on a face of the printed circuit board, facing away from the structured conductor layer.

Within the scope of the invention, sensor chips are understood to be semiconductor components which have a sensor, which for example can respond to electromagnetic radiation, to chemical influences, to pressure, force, temperature, etc., wherein the chip often contains semiconductor components, ICs, and passive electrical components in addition to the actual sensor. Here, a sensor has an area which is sensitive to the variable that is to be detected, for example incident light radiation, or which takes up a force, comprises a membrane, etc., and which is referred to here as a sensor face for the sake of simplicity.

A method for producing a sensor module in which a plurality of sensors with their sensory region (sensor face) and with their contact points (terminals) are arranged on a carrier, which for example consists of polished copper, and around which a mould material is then cast, such as an epoxy resin filled with a filler material, is known from DE 10 2006 045 900 A1. Once the hot mould material has cooled, the carrier is removed, which can be performed for example chemically by means of nitric acid or mechanically, and individual modules are provided following a cutting operation. In order to connect the contact points to contact structures protruding from the carrier and consisting of nickel coated with gold, a conductive and adhesive seal material can also be used. The problem of protection of the sensor faces of a chip against chemical or mechanical influences during the production of the modules is described in this document, but not that of the embedding of a sensor element in a printed circuit board or the necessary contact with a conductor structure.

One object of the invention lies in embedding a sensor chip, in which there are arranged a sensor face and terminals on a face of the chip, in a printed circuit board and contacting this with a conductive structure of the printed circuit board, wherein this is performed in the simplest way possible, securely, and with particular care taken of the sensor face. A further object lies in creating a printed circuit board having an embedded sensor chip, which printed circuit board can be easily produced and can be made very thin.

These objects are achieved with a method of the type mentioned in the introduction, which method comprises the following steps:
 a) providing an adhesive film,
 b) printing a conductor structure formed from a conductive paste onto a surface of the adhesive film,
 c) placing the at least one sensor chip with the face comprising the at least one sensor face and the terminals onto the conductor structure formed from a conductive paste, in an indexed manner,
 d) curing the conductive paste,
 e) applying an insulation layer having a conductor layer arranged thereabove to the surface of the structure, created in the previous steps, comprising the chip,
 f) laminating the structure created in the previous steps,
 g) structuring the conductor layer and forming vias from the conductor layer to the conductor structure on the surface of the adhesive film, and
 h) removing the adhesive film.

In an advantageous variant the conductive paste is an epoxy resin adhesive.

It is also expedient when, in step e), the curing is performed by application of UV light and/or heat.

In a proven embodiment the insulation layer is a prepreg and/or the conductor layer is a copper layer.

Particularly in the case of the use of an epoxy resin adhesive as conductive paste, it is advantageous when the adhesive film is a silicone-based adhesive film, in order to ensure simple and secure detachment of the adhesive tape without destroying the conductor structure.

In a preferred variant the printing in step b) can be performed advantageously with the aid of a screen-printing method.

It is also recommended if the insulation layer applied in step e) has a recess in the region of the at least one sensor chip.

The stated objects are also achieved with a printed circuit board of the above-specified type, in which, in accordance with the invention, the terminals of the sensor chip are connected to a conductor structure consisting of a conductive paste and vias extend from this conductor structure to the structured conductor layer.

Figure 2:
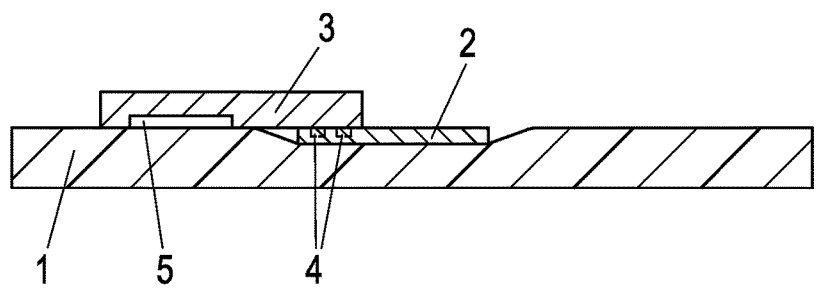
Figure 3:
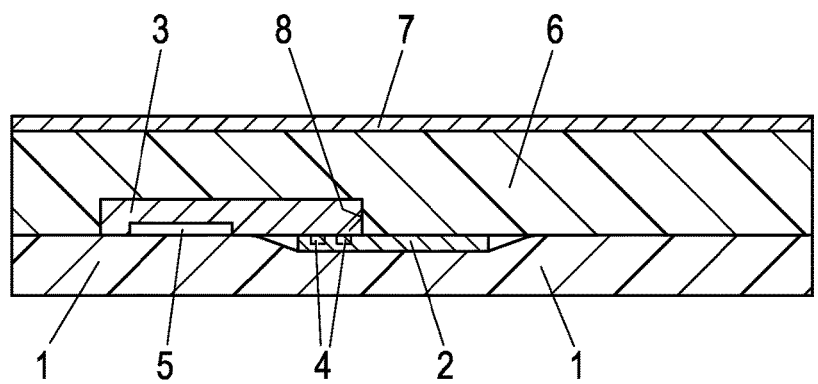
Figure 4:
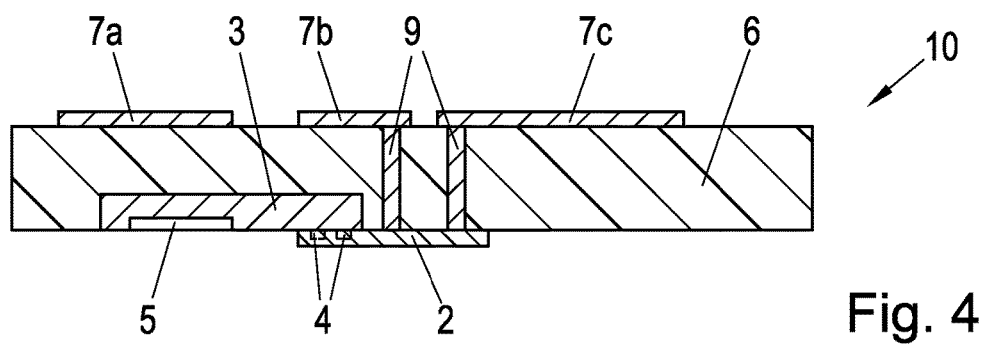
Figure 5:
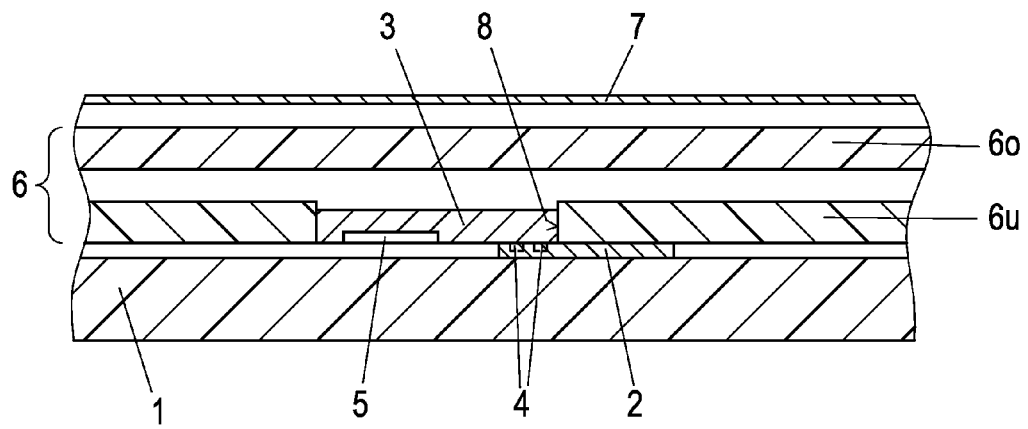
Figure 6:
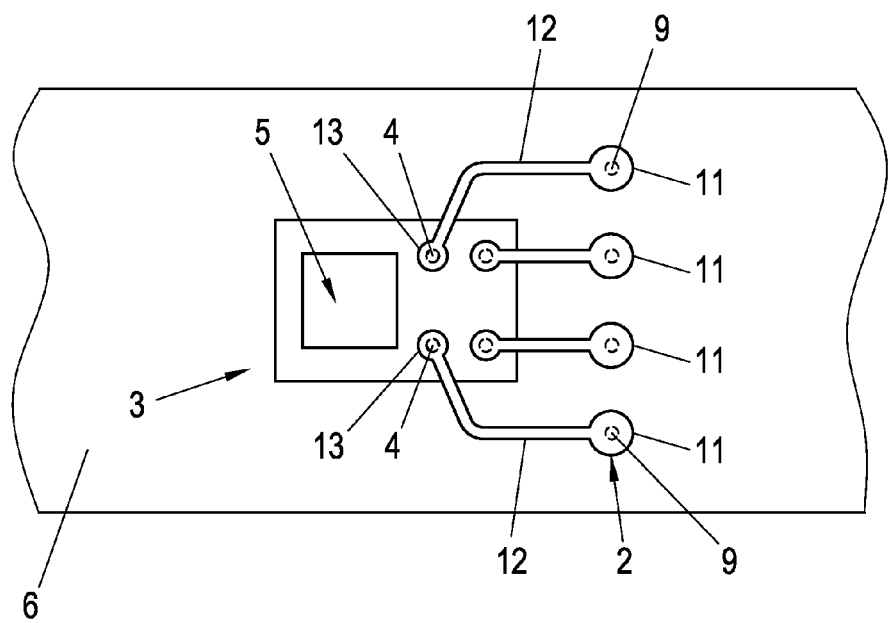

The invention and further advantages will be explained in greater detail hereinafter on the basis of an exemplary embodiment illustrated in the drawings, in which FIG. 1 shows, in a sectional view, a structure produced in the first steps of the method, consisting of an adhesive film with a printed conductor structure formed from a conductive paste, FIG. 2 shows the structure of FIG. 1 once a sensor chip has been placed in position, FIG. 3 shows the structure following lamination with a prepreg having a conductor layer, FIG. 4 shows the finished printed circuit board once the adhesive film has been removed, FIG. 5 shows, in a sectional view, the individual parts for a variant of the production, and FIG. 6 shows a schematic and partial view from below of the printed circuit board according to FIG. 4.

The method according to the invention and also a printed circuit board according to the invention will now be explained with reference to the drawings. Here, it should be noted that the terms "top" and "bottom" used hereinafter relate only to the illustrations in the drawings and are used to facilitate the description.

FIG. 1 shows an adhesive film 1, which is the starting point of the method according to the invention. This adhesive film 1 is preferably an adhesive film having a silicone-based adhesive layer, wherein the overall thickness of carrier film and adhesive layer can lie in a range of 50 to 300 μm. Such adhesive films are commercially obtainable for example under the name Tacsil F20 from the company Taconic. The adhesive film, which is adhesive on one side, is supported on a smooth surface, for example on a vacuum table, during the process described hereinafter.

A conductor structure 2 formed from a conductive paste is now applied to a surface of this adhesive film 1, in the drawing the upper surface, preferably by means of a printing method, such as screen printing, flexographic printing, offset printing, or inkjet printing. The conductive paste is preferably an epoxy resin adhesive, wherein the combination "epoxy resin adhesive and silicone-based adhesive film" is particularly advantageous since it promotes a subsequent reliable and non-destructive detachment of the adhesive film. A conductive paste of this type for application by screen printing is commercially obtainable for example under the name Epo-tek® H20E from the company Epoxy Technology, wherein it receives its conductivity, which lies in the range of more than 2500 $\Omega^{-1} \cdot m^{-1}$, by the addition of silver for example. The layer thickness of the conductor structure 2 may preferably lie in a range of 5 to 30 μm.

In a next step, see FIG. 2, a sensor chip 3, of which the electrical terminals 4 and sensor face 5 lie on the same face of the chip, is placed onto the conductor structured 2 formed from conductive paste. The placement is performed in an indexed manner, i.e. the terminals 4 of the sensor chip 3 are aligned with the corresponding contact points of the conductor structure 2. During this placement the terminals 4 penetrate the conductor structure 2, which is still soft, so that an electrical connection is created. The conductive paste of the conductor structure 2 is then cured, for example by thermal or UV curing.

A further step now makes provision for the structure according to FIG. 2 to be integrated into an insulation layer 6 with a conductor layer 7 arranged thereabove, as is illustrated in FIG. 3. In the present case what is known as a core is produced, consisting of commercially available prepregs, for example FR 4, as insulation layer 6 and a single conductor layer 7, wherein the insulation layer 6 expediently has a recess 8 in the region of the sensor chip 3, which recess receives the chip 3. The structure thus obtained is subjected to a conventional lamination process, which also leads to the curing of the insulation layer 6.

It can be seen from FIGS. 2 and 3 that the film 1 is resiliently deformed or curved away in the region of the conductor structure 2, wherein it should be noted, however, that this is shown to an exaggerated extent in the drawing, since the drawing is not to scale for the purpose of improved visibility of the individual parts. The conductor structure 2 is actually very thin compared to the film, specifically 10 μm for example compared to 200 μm for example.

The conductor layer 7 can now be structured in the conventional manner hereinafter in order to obtain individual conductor runs 7a, 7b, 7c. Vias 9 are also formed between upper conductor runs and the conductor structure 2. This is implemented in the known manner by first forming bores through the structure and then filling or lining these with a conductive material. By way of example, this can be achieved by depositing copper or by filling the bores with a conductive paste. The film 1 can then be removed, whereby the sensor face is also exposed. The printed circuit board 10 shown in FIG. 4 is provided as a result.

It should be clear that the illustrations in FIGS. 1 to 4 generally show only a detail from a larger printed circuit board structure, and in practice a plurality of sensors and other components are embedded or provided on a printed circuit board at different points and can be connected to conductor structures. Further insulation layers and conductive layers can also be applied to a printed circuit board 10 according to FIG. 4. By way of example, an insulation layer can be arranged on the conductor structure 7a, 7b, 7c, and said insulation layer can be followed by a conductor layer, wherein layers can also be arranged between all conductive layers. In the case of the invention the conductive paste serves to contact and also to (temporarily) fix the sensor chip 3 on the film 1, which, as already mentioned, does not permanently connect to the paste of the conductor structure 2. When selecting the materials of conductive paste and the film 2, the requirement that the film 2 must be detachable without destroying the conductor structure 2 must therefore be taken into consideration.

With regard to the recess 8 for receiving the sensor chip 3, reference is also made to FIG. 5, which shows a possibility as to how the chip 3 can be embedded in the insulation layer 6. In this figure the individual parts already known from the previous drawings and used for the method are shown, wherein the insulation layer 6, however, consists of two individual layers 6o and 6u, of which the lower individual layer 6u has the recess 8 receiving the sensor chip 3. The parts shown in FIG. 5 lead to a printed circuit board as shown in FIG. 5 after the lamination. It should be mentioned that the structure referred to further above as the "core", consisting there of an insulation layer and a conductor layer, can also be produced in a different way and form, without deviating from the invention. The prepregs 6o, 6u can thus in turn consist of a number of prepregs, however what are known as bonding sheets, asymmetrical prepregs, liquid resin mixtures, or other methods can also be used to produce the core.

Since the sensor chip, as already mentioned above, is generally very thin, it will be possible in many cases to also refrain from forming a recess 8 in the insulation layer 6. In the case of applying the insulation layer in liquid form and also with use of materials without glass fibre reinforcement, the recess can thus also be omitted.

FIG. 6 shows a possible conductor structure 2 used in this example in a view from below of FIG. 4. What can be seen are the rectangular sensor chip 3 with sensor face 5, which is approximately square here, on the "underside" of the chip, and four electrical terminals 4, which are electrically connected to the conductor structure 2 formed from a conductive paste and are shown by dashed lines. This conductor structure has four terminal pads 11 corresponding to the four terminals, the vias 9 leading to said terminal pads (see FIG. 4). The terminal pads 11 are connected via conductor runs 12 to terminal pads 13 for the chip terminals 4.

The invention claimed is:

1. A printed circuit board consisting of at least one insulation layer and at least one structured conductor layer having at least one embedded sensor chip, in which at least one sensor face and terminals are arranged on a face of the sensor chip and lie in a substantially coplanar manner on a face of the printed circuit board, facing away from the structured conductor layer, wherein a surface of the at least one sensor face, a surface of the at least one sensor, and a surface of the at least one insulation layer are coplanar, and wherein the terminals of the sensor chip are connected to a conductor structure consisting of a conductive paste, and vias extend from this conductor structure to conductive tracks of the structured conductor layer.

2. The printed circuit board of claim 1, wherein the face of the sensor chip on which the at least one sensor face and the terminals are arranged is substantially coplanar with the surface of the insulation layer and terminates flush therewith.

3. The printed circuit board of claim 2, wherein the conductor structure is attached to the substantially coplanar surface of the sensor chip and the insulation layer, facing away from the structured conductor layer.

4. The printed circuit board of claim 1, wherein at least a part of the conductor structure is attached to the surface of the insulation layer, facing away from the structured conductor layer.

5. The printed circuit board of claim 1, wherein at least a part of the conductor structure is attached to the surface of the sensor chip on which the terminals of the sensor chip are arranged.

6. The printed circuit board of claim 1, wherein the terminals of the sensor chip are aligned with the corresponding contact points of the conductor structure and said terminals penetrate the conductor structure.

7. The printed circuit board of claim 1, wherein the layer thickness of the conductor structure is in the range of 5 μm to 30 μm.

8. The printed circuit board of claim 1, wherein the conductor structure is made of a hardened conductive paste.

9. The printed circuit board of claim 1, wherein the sensor chip is arranged at a position that is outermost of built-up layers of the printed circuit board.

* * * * *